United States Patent
Taunier et al.

(10) Patent No.: US 7,026,258 B2
(45) Date of Patent: Apr. 11, 2006

(54) METHOD FOR MAKING THIN-FILM SEMICONDUCTORS BASED ON I-III-VI$_2$ COMPOUNDS, FOR PHOTOVOLTAIC APPLICATIONS

(75) Inventors: Stéphane Taunier, Paris (FR); Olivier Kerrec, Rueil Malmaison (FR); Michel Mahe, Saint-Mammes (FR); Denis Guimard, Paris (FR); Moëz Ben-Farah, Avon (FR); Daniel Lincot, Antony (FR); Jean-François Guillemoles, Paris (FR); Pierre-Philippe Grand, Charenton-le-Pont (FR); Pierre Cowache, Mitry-Mory (FR); Jacques Vedel, Asnieres-sur-Seine (FR)

(73) Assignees: Electricite de France Service National, Paris (FR); Centre National de la Recherche Scientifique-CNRS, Paris (FR)

( * ) Notice: Subject to any disclaimer, the term of this patent is extended or adjusted under 35 U.S.C. 154(b) by 0 days.

(21) Appl. No.: 10/512,961

(22) PCT Filed: Apr. 23, 2003

(86) PCT No.: PCT/FR03/01282

§ 371 (c)(1),
(2), (4) Date: Oct. 27, 2004

(87) PCT Pub. No.: WO03/094246

PCT Pub. Date: Nov. 13, 2003

(65) Prior Publication Data

US 2005/0215079 A1    Sep. 29, 2005

(30) Foreign Application Priority Data

Apr. 29, 2002 (FR) .................................. 02 05362

(51) Int. Cl.
*H01L 21/477* (2006.01)
(52) U.S. Cl. ......................... 438/795; 438/796; 427/76
(58) Field of Classification Search ................ 438/795, 438/756

See application file for complete search history.

(56) References Cited

U.S. PATENT DOCUMENTS 5,578,503 A    11/1996    Karg et al.
5,674,555 A  * 10/1997    Birkmire et al. .............. 427/76

FOREIGN PATENT DOCUMENTS

WO    WO 00/62347    10/2000

OTHER PUBLICATIONS

Guillen et al.; "Cathodic Electrodeposition of CuInSe$_2$ Thin Films"; 2194 Thin Solid Films; 195 Jan. (1991), Nos. 1/2, Lausanne, CH, pp. 137-146, XP00177084.

(Continued)

*Primary Examiner*—Jennifer Kennedy
*Assistant Examiner*—Kyoung Lee
(74) *Attorney, Agent, or Firm*—Kilpatrick Stockton LLP

(57) ABSTRACT

The invention concerns a method for making thin-film CIGS which consists in: electrochemically depositing on a substrate a layer of stoichiometry close to CuInSe$_2$; then rapidly annealing said layer from a light source with pulses of sufficient power to recrystallize CIS. Advantageously, the electrodeposited elements are premixed. Thus, after the deposition step, a homogeneous matrix is obtained which can support sudden temperature increases during the rapid annealing.

17 Claims, 4 Drawing Sheets

OTHER PUBLICATIONS

Tsvetkova et al., "Preparation and structure of annealed $CuInSe_2$ electrodeposited films"; Thin Solid Films 311 (1997) pp. 101-106.

Chowles et al., "Deposition and Characterization of $CuInSe_2$"; Renewable Energy, vol. 6, No. 5-6, 1995, pp. 613-618.

Guillén et al.; "Recrystallization and components redistribution processes in electrodeposited $CuInSe_2$ thin films"; Thin Solid Films 387; 2001, pp. 57-59.

Pern et al.; "Characterizations of Electrodeposited $CuInSe_2$ Thin Films: Structure, Deposition and Formation Mechanisms"; 2194 Thin Solid Films; 202 Jul. 30, (1991), No. 2, Lausanne, CH, pp. 299-314.

Nakamura et al.; "Composition control of electrodeposited Cu-In-Se layers for thin film $CuInSe_2$ preparation"; Solar Energy Materials and Solar Cells; 50 (1998), pp. 25-30.

Calixto et al.; "Compositional and optoelectronic properties of CIS and CIGS thin films formed by electrodeposition"; Solar Energy Materials & Solar Cells 59 (1999), pp. 75-84.

* cited by examiner

METHOD FOR MAKING THIN-FILM SEMICONDUCTORS BASED ON I-III-VI$_2$ COMPOUNDS, FOR PHOTOVOLTAIC APPLICATIONS

CROSS REFERENCE TO RELATED APPLICATIONS

This application is a national phase of PCT/FR03/01282 filed Apr. 23, 2003 which claims priority to French Patent Application No. :02 05362 filed Apr. 29, 2002

BACKGROUND OF THE INVENTION

The invention concerns the field of semiconductor thin film deposition for photovoltaic applications.

Thin films of copper and indium and/or gallium diselenide and/or disulfide (CIGS) are deposited on a substrate in order to fabricate photovoltaic cells. Such compounds of general formula CuGa$_x$In$_{1-x}$Se$_{2-y}$S$_y$ (with x between 0 and 1 and y between 0 and 2) are regarded as highly promising and could constitute the next generation of thin-film solar cells. CIGS semiconductor materials have a direct band gap of between 1.0 and 1.6 eV, which permits strong absorption of solar radiation in the visible range. Record conversion efficiencies of more than 18% have recently been obtained with cells of small surface areas.

CIGS are also referred to as I-III-VI$_2$, referring to the chemical nature of their constituents, where:
  the element Cu represents an element from column I (column 1B of the periodic table),
  the element In and/or the element Ga represent elements from column III (column 3B of the periodic table), and
  the element Se and/or the element S represent an element from column VI (column 6B of the periodic table).

There are therefore approximately two column VI atoms per column I atom and per column III atom in the monophase domain around the I-III-VI$_2$ composition of the CIGS.

The CIGS layers used for photovoltaic conversion need to have a p-type semiconductor character and good charge transport properties. These charge transport properties are favored by good crystallinity. The CIGS thus need to be at least partially crystallized in order to have sufficient photovoltaic properties for their use in the fabrication of solar cells. Crystallized CIGS compounds have a crystallographic structure corresponding to the chalcopyrite or sphalerite systems, depending on the deposition temperature.

When they are deposited at a low temperature (precursor deposition), CIGS thin films are weakly crystallized or amorphous, and annealing of the layers has to be carried out by supplying heat in order to obtain an improvement of the crystallization of the CIGS and satisfactory charge transport properties.

At the temperatures which allow at least partial crystallization of the CIGS, however, one of the constituent elements of the CIGS (principally selenium Se) is more volatile than the other elements. It is therefore difficult to obtain crystallized CIGS with the intended composition (close to the I-III-VI$_2$ stoichiometry) without adding selenium for the annealing of the precursor layer.

Furthermore, in order to obtain a p-type semiconductor character (conduction by holes) the composition of the layers should have a slight deviation from the I-III-VI$_2$ stoichiometry in favor of the VI element.

In the fabrication of CIGS thin films for photovoltaic applications, therefore, the prior art embodiments involve annealing the precursor deposits in the presence of a selenium excess in the vapor phase.

The best photovoltaic conversion efficiencies (more than 17%) have been obtained from CIGS when preparing thin films by evaporation. Evaporation is an expensive technique which is difficult to use on the industrial scale, however, particularly because of nonuniformity problems with the thin-film deposits over large surface areas and a low efficiency of using the primary materials.

Cathodic sputtering is more suitable for large surface areas, but it requires very expensive vacuum equipment and precursor targets. The term "precursors" means intermediate compounds whose physicochemical properties are distinct from those of CIS (or CIGS) and make them incapable of photovoltaic conversion. They are initially deposited in a thin-film form, and this thin film is subsequently processed in order to form the intended CIGS deposit.

Electrochemical deposition offers an advantageous alternative. The difficulties which are encountered, however, relate to controlling the quality of the electrodeposited precursors (composition, morphology) and processing them with a view to providing adequate electronic properties for the photovoltaic conversion. Several approaches have been proposed in order to overcome these difficulties, including the following:
  separate or sequential electrodeposition of the Cu then In precursors, followed by addition of Se (a step referred to as "selenization"), as described in U.S. Pat. No. 4,581,108;
  electrodeposition of (Cu, In) binaries in the presence of an Se suspension, as described in U.S. Pat. No. 5,275,714.
This is because it is easier to apply a single precursor at the time.

More recent developments (U.S. Pat. No. 5,730,852, U.S. Pat. No. 5,804,054 ) propose electrodeposition which is equivalent to depositing a layer of precursors with the composition Cu$_x$In$_y$Ga$_z$Se$_n$ (with x, y and z between 0 and 2, and n between 0 and 3) by using a pulsed current method. The electrodeposition is followed by a step of evaporating the elements In, Ga and Se in order to increase their levels compared with the electrolyzed layer.

As regards "pure" electrodeposition, that is to say electrodeposition without an evaporation step and with the I-III-VI$_2$ stoichiometry, the best efficiencies are about 6 to 7% as indicated in the following publications:
  GUILLEMOLES et al., *Advanced Materials*, 6 (1994) 379;
  GUILLEMOLES et al., J. Appl. Phys., 79 (1996) 7293.

These publications furthermore indicate that better results are obtained when the annealing is carried out under selenium vapor pressure, at temperatures in excess of 450° C., in a vacuum. Conventional annealing is then performed in a diffusion furnace, under elementary Se pressure. Such annealing, however, is relatively time-consuming (of the order of one to a few hours).

Document U.S. Pat. No. 5,578,503 describes a two-step method which firstly involves deposition by cathodic sputtering then rapid annealing (with lamps) of the precursors deposited in this way. In particular Cu, In and Se precursor elements are deposited separately in an elementary form (Cu(0), In(0) and Se(0)) or in the form of binaries (such as In$_2$Se$_3$). The structure initially deposited before annealing is thus essentially heterogeneous and is in the form of a multiplicity of successive sheets (stacks of Cu$^0$/In$^0$/Se$^0$ or Cu$^0$/In$_2$Se$_3$, or a combination of the two) in the thickness direction of the layer. This mixture of precursors subsequently undergoes rapid annealing, comprising a temperature rise followed by a holding time needed to homogenize the CIS layer. When it is deposited by sputtering and has a heterogeneous structure in sheets, however, the thin film is not good at withstanding abrupt rises in temperature, especially in mechanical terms. Since the thermal expansion coefficient of the layer is spatially inhomogeneous, delamination problems occur with this layer during the annealing step. Although advantageous, such a procedure is therefore not yet completely satisfactory.

More generally, the methods of deposition by evaporation or sputtering use sources which commonly consist of pure elements, or sometimes binaries but rarely ternaries. A difficulty arises when carrying out such methods. It involves transfer of the elements from the source to the substrate. This transfer is not the same for all the elements, and the evaporation speed or sputtering rate may differ from one element to another. At a high temperature, in particular, the vapor pressures of the elements (their volatility) may differ significantly. This effect is commensurately more problematic when there are a large number of elements in the alloy to be obtained (ternary CIS, quaternary CIGS, etc.).

It is an object of the present invention to improve the situation.

SUMMARY OF THE INVENTION

To that end, it relates to a method of fabricating I-III-VI$_2$ semiconductor alloys in thin films for photovoltaic applications, wherein:

a) a thin film of a precursor with a slightly excess composition of VI element compared with a final desired alloy composition is deposited on a substrate, the constituent elements of the precursor being intimately mixed so as to give the precursor a structure having nanometric alloy grains joined by phases which are richer in VI element, and b) rapid annealing of the layer obtained in step a) is carried out using an electromagnetic radiation source, with an electromagnetic power greater than or of the order of a few W/cm$^2$, which is sufficient to activate the VI element and make all of said alloy grains react so as to improve the crystallization of said layer, and for durations less than or of the order of tens of seconds, which are sufficiently short to obtain substantially said desired composition in the layer and give said layer photovoltaic properties.

The term "nanometric grains" means alloy grains, most of which advantageously have a physicochemical nature close to that of the alloy intended in step b) (in terms of both composition and bonds between atoms, in particular) and which may amount to several tens of nanometers.

The grains then together form a matrix which is advantageously compact and capable of withstanding an abrupt temperature rise during the annealing step b).

Overall therefore, the present invention involves the combination of two steps which consist in:

preparing a precursor in which the elements are intimately bound, this precursor having a morphology capable of withstanding the rapid annealing in step b), and rapidly annealing this precursor, so that the kinetics of the processing are fast enough to limit exodiffusion of the VI element (owing to its volatility) during the annealing, while allowing satisfactory crystallization of the layer.

Furthermore, as indicated above, the conservation of the VI element in the layer after annealing imparts a p-type semiconductor character favorable for the photovoltaic conversion.

In a preferred embodiment, both for speed and for simplicity of industrial implementation, said thin film is deposited by electrochemistry in step a).

In a preferred embodiment, the annealing in step b) is carried out by illumination, preferably direct illumination, using a light source. As a variant, the annealing may be carried out by induction.

For CIS (or CIGS) annealing in step b), the temperature of the layer is preferably raised to more than 450° C.

Advantageously, the rapid annealing in step b) may be carried out by transferring an illumination power density of the order of ten watts per cm$^2$ to the thin film for durations less than or of the order of ten seconds.

The photovoltaic efficiency of the thin films obtained after annealing may be of the order of or even more than 8% under these conditions.

BRIEF DESCRIPTION OF THE DRAWINGS

Other characteristics and advantages of the present invention will become apparent on reading the following detailed description and studying the appended drawings, in which.

MORE DETAILED DESCRIPTION

Figure 1:
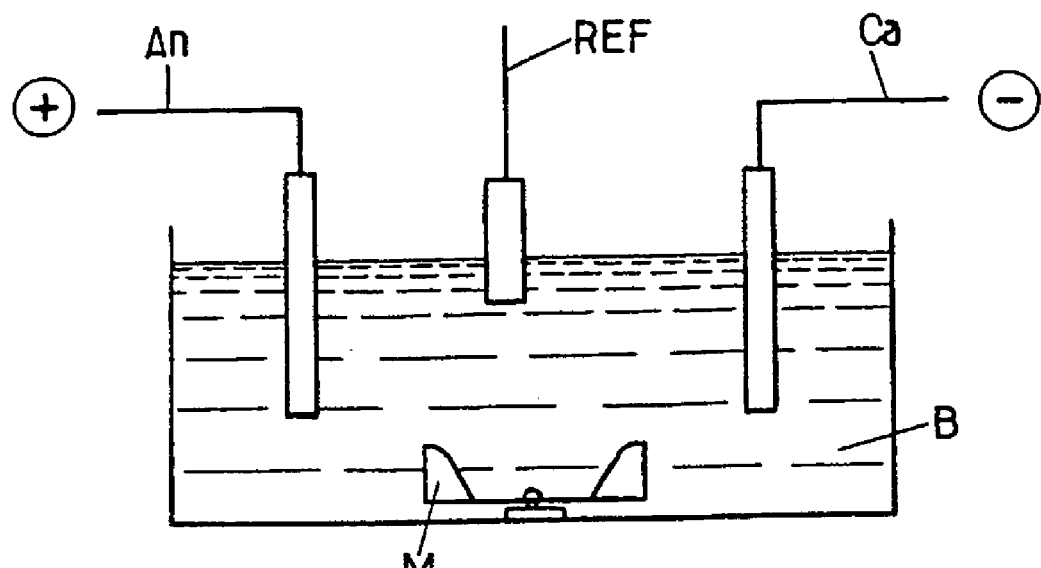
FIG. 1 schematically represents a system for electrochemical deposition of a CIS thin film.
Figure 4:
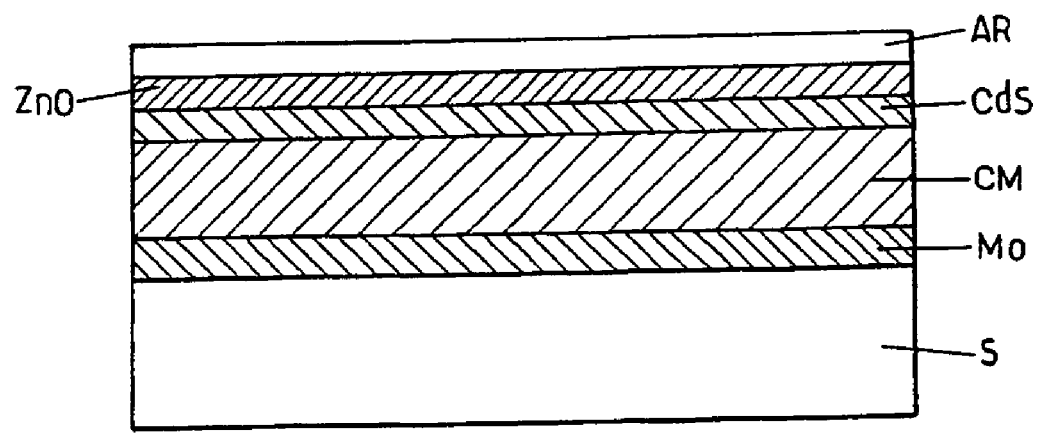
FIG. 4 schematically represents the thin-film structure of a cell intended for photovoltaic applications.

Referring to FIG. 1, thin films of copper and indium diselenide are obtained at room pressure and temperature by electrodeposition of a precursor film CM on a glass substrate S previously covered with molybdenum Mo (FIG. 4). Advantageously, the substrate S is initially covered with an additional electronic conductive layer, for example metallic or in an oxide form (not shown). This conductive layer may furthermore rest on one or more sublayers used for a specific application (diffusion barrier, mirror or the like) in the fabrication of photovoltaic cells.

Referring to FIG. 1, the electrodeposition is carried out in a bath B containing an indium salt, a copper salt and dissolved selenium oxide. In order to obtain a CIGS thin film whose general composition corresponds substantially to $CuGa_xIn_{1-x}Se_2$ (with x between 0 and 1), it will be understood that the bath may furthermore contain a gallium salt. In an even more sophisticated variant, sulfur salts (for example sulfite or thiosulfate salts) are added to the solution so as to obtain a deposit which has a composition close to $CuGa_xIn_{1-x}Se_{2-y}S_y$ (with x between 0 and 1 and y between 0 and 2). The salts are mixed during the deposition by using a rotary agitator M immersed in the electrochemical tank B.

According to an advantageous characteristic, therefore, the thin film is obtained by electrodepositing a precursor whose constituent elements are intimately premixed.

The concentrations of the elements of the precursor (in the form of salts and oxide in the solution) are between $10^{-4}$ and $10^{-1}$ mol/l. The pH of the solution is preferably fixed between 1 and 3. The potential applied to the molybdenum electrode (cathode Ca) is between −0.8 volt and −1.9 volts with respect to the reference electrode REF, here made of mercury(I) sulfate.

Thin-film deposits with a thickness of between 0.1 and 3 µm are obtained with current densities of about 0.5 to 4 mA/cm².

As a nonlimiting example, a precursor deposit is formed from a bath whose concentrations are as follows:

$[Cu(SO_4)]=1.0 \cdot 10^{-3}$ mol/l, $[In_2(SO_4)_3]=6.0 \cdot 10^{-3}$ mol/l, $[H^2SeO_3]1.7 \cdot 10^{-3}$ mol/l, $[Na_2(SO_4)]=0.1$ mol/l.

The pH of the bath is 2 in this example. The precursors are deposited by cathodic reaction with a set potential, preferably −1 volt with respect to the mercury(I) sulfate reference electrode. The current density is −1 mA/cm².

In so far as the copper and indium salts, as well as the dissolved selenium oxide, are mixed in the solution of the bath B, a precursor whose elements are intimately premixed is obtained at the end of the aforementioned electrodeposition step a).

The obtained precursor film is dense, adherent and has a homogeneous morphology, and its composition is close to the stoichiometric composition Cu (25%), In (25%), Se (50%).

The following table indicates the atomic composition by percentage, at different points (points 1 to 5) of a CIS precursor film electrodeposited on a substrate measuring about 10 cm², these compositions having been analyzed by an electron microprobe (WDX).

|  | Cu (% at.) | In (% at.) | Se (% at.) | In/Cu | Se(In + Cu) |
| --- | --- | --- | --- | --- | --- |
| Point 1 | 22.5 | 24.3 | 53.3 | 1.080 | 1.14 |
| Point 2 | 22.7 | 24.4 | 52.9 | 1.075 | 1.12 |
| Point 3 | 22.6 | 24.6 | 52.8 | 1.088 | 1.12 |
| Point 4 | 22.9 | 24.5 | 52.6 | 1.070 | 1.11 |
| Point 5 | 22.9 | 24.3 | 52.8 | 1.061 | 1.12 |
| Mean | 22.72 | 24.42 | 52.88 | 1.075 | 1.122 |
| Standard deviation | 0.179 | 0.130 | 0.259 | 0.010 | 0.011 |

Referring to the column that relates to the selenium composition Se, a slight excess of selenium can nevertheless be observed compared with the quantity needed to combine with the copper in the form of $Cu_2Se$ and with the indium in the form of $In_2Se_3$. This selenium excess is about 10% in the example described, although it may be even less than this value as will be seen below.

The selenium excess is a favorable element for obtaining a p-type semiconductor character of the layer after the annealing step, which allows satisfactory photovoltaic conversion.

A slight indium excess of about 7% is likewise observed with respect to the copper. This indium excess has also been found to play a favorable role for obtaining the photovoltaic properties.

It is possible to verify that the deposit complies with a satisfactory composition uniformity in the plane of the thin film. The Applicants have furthermore observed that this uniformity was also complied with through the layer thickness, in particular by carrying out fine analyses such as SIMS (Secondary Ion Mass Spectroscopy) or EELS (Electron Energy Loss Spectroscopy).

It is also possible to create a composition gradient in the deposited layer, however, for example by varying the proportion of copper composition as a function of the thickness (in particular by controlling the value of the electrochemical potential set during the electrodeposition). Such a composition gradient advantageously makes it possible to obtain confinement of the carriers in the intended photovoltaic applications.

Figure 2:
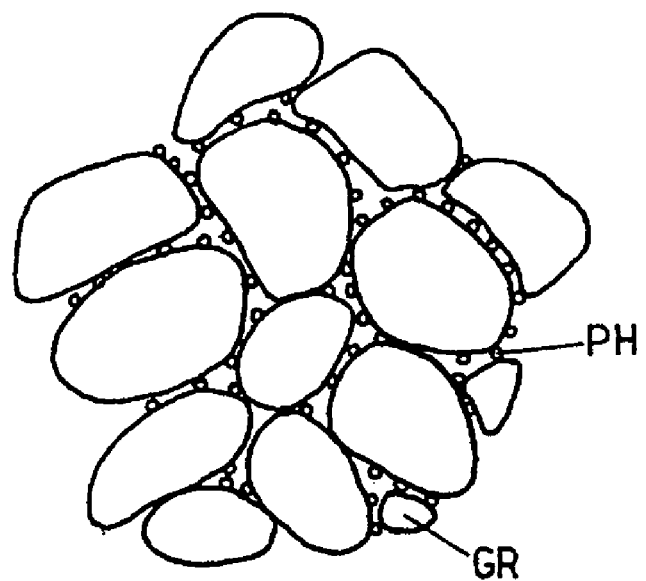
FIG. 2 schematically represents the appearance of the structure in the form of a precursor matrix before annealing, on the nanometric scale.

Such fine analyses (SIMS, EELS) have furthermore shown that the composition of the electrodeposited precursor is mostly close to that desired for the final alloy, in grains GR measuring a few tens of nanometers which are represented by way of illustration in FIG. 2. In the final composition of the alloy obtained after the rapid annealing step, the selenium excess is much less than of the order of 1%, but is sufficient to "dope" (as p-type doping at about $10^{16}$ cm$^{-3}$) the annealed CIS. It will therefore be understood that the composition of the alloy obtained after annealing is very close to that of the I-III-VI$_2$ stoichiometric alloy. It is substantially this composition which is essentially present in the grains GR of the electrodeposited precursor before annealing.

Referring to FIG. 2, the films obtained after the electrodeposition step consist of a matrix which is generally amorphous (or weakly crystallized compared with the alloy after annealing) but comprises mostly grains GR of CIS (crystallites of the order of tens of nanometers).

The term "matrix" means a composite nature of the layer which may have a plurality of possible phases: ternary (in the case of CIS), binary (for example $Cu_xSe$ with x close to 2, and $In_xSe_y$ with x close to 2 and y close to 3) or even elementary (selenium or the like). As indicated above, the grains GR have a composition close to that desired for the final alloy, for example $CuInSe_2$ in the case of CIS, while the precursor overall has a selenium excess of about 10%. It is thus found that phases PH richer in selenium are present outside the grains or at the surface of the grains as represented in FIG. 2 by way of example, for example elementary selenium Se or the binary CuSe.

The volume of the layer occupied by the grains GR is nevertheless very much predominant compared with that occupied by these phases PH. The precursor electrodeposited in this way overall has a physicochemical nature mostly close to that of the final desired alloy, and not only in terms of composition but also in terms of chemical bonds, which are those of the desired alloy in the grains GR. The intimate mixing of the elements (and therefore the short migration distances of the elements during the annealing) thus contributes to the alloy not being degraded during the annealing.

Further to the majority CIS grains, binary grains with compositions close to $Cu_2Se$ and $In_2Se_3$ (not shown in FIG. 2) may also coexist locally. During the rapid annealing step b), these grains are also capable of reacting together to give a coarser crystallized grain with a composition close to $CuInSe_2$.

Even though the risks of exodiffusion during the rapid annealing are limited, a layer that covers the precursor layer is furthermore deposited before the annealing step in order to further limit any exodiffusion of elements of the precursor, such as Se, during the annealing step.

According to an advantageous characteristic of the present invention, it is thus possible to further limit exodiffusion of the volatile elements during the annealing by applying a protective layer CP (FIG. 3) to the surface of the CIS layer CM, before the annealing step. By way of example, a film of sodium chloride (or alternatively sodium or potassium fluoride) may be used as a protective layer. It is formed by immersing the precursor film in an aqueous solution of NaCl and drying in air. This protective layer is advantageously removed after the annealing treatment, for example by dissolving (in an aqueous solution, for example). In another embodiment, a surface layer of elementary selenium may instead be provided in order to limit exodiffusion of the selenium during the annealing.

It will therefore be understood that the selenium excess in the initial precursor may be reduced compared with the above table of compositions (to values of less than a few percent) when such a protective layer CP is added.

The good degree of oxidation of the elements mixed in this way during the electrodeposition step avoids uncontrolled chemical reactions during the annealing. In other words the free energy of reaction is relatively low, which avoids the occurrence of highly exothermic reactions such as those of the elementary indium and selenium in the CIS. In fact, the elements In and Se in the elementary form $In^0$, $Se^0$ are highly reactive. In particular for this reason, excessively rapid annealing in a so-called "sheet" deposition method as described above could lead to degradation of the layer.

This matrix is furthermore substantially homogeneous in the spatial distribution of its expansion coefficient. It is therefore capable of withstanding an abrupt temperature rise during the step of annealing by illumination, compared with the aforementioned heterogeneous sheet structure.

More generally, the physicochemical nature (degree of oxidation, density, thermal expansion coefficient) of the precursor is mostly very close to the $CuInSe_2$ crystallized phase, which greatly limits the occurrence of inhomogeneities during the annealing (swelling, localized delamination). It will thus be understood that the matrix which is obtained after the electrodeposition step, and which comprises the premixed elements of the precursor, advantageously makes it possible to carry out rapid annealing, this matrix being capable of withstanding transferred powers greater than or equal to $10 \text{ W/cm}^2$.

The precursor films have only weak photovoltaic properties per se after the deposition step. In fact, these photovoltaic properties are obtained only after a thermal annealing treatment. The recrystallization of the thin film makes it possible to obtain good charge transfer properties for the photovoltaic conversion.

Figure 3:
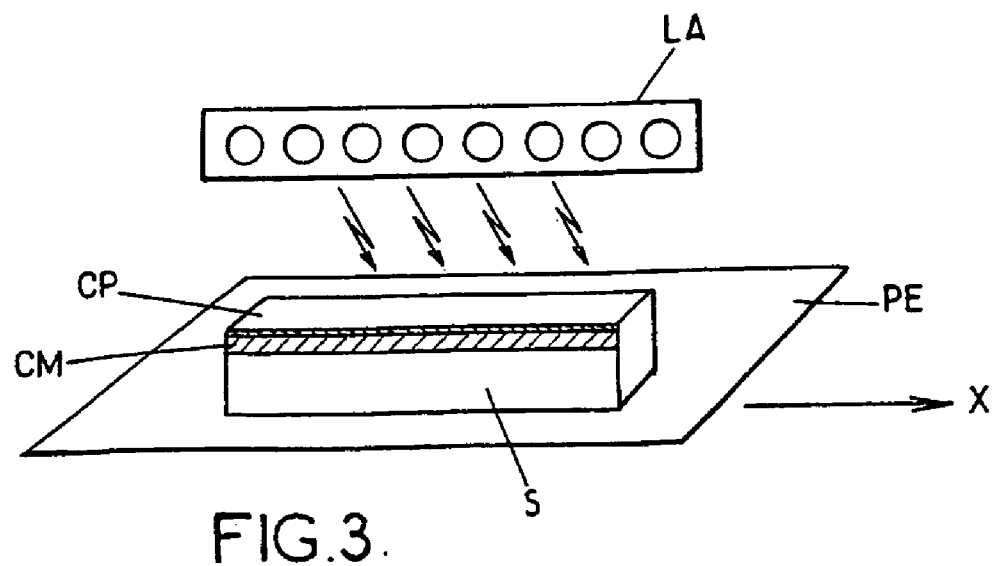
FIG. 3 represents a system for rapid annealing, by illuminating the thin film obtained by electrodeposition.

According to one of the characteristics of the invention, this heat treatment is carried out by rapidly annealing the electrodeposited thin film CM. Referring to FIG. 3, the thin film CM electrodeposited on the substrate S is arranged on a sample holder PE, which is preferably capable of being moved in a horizontal plane (displacement along the axis X as represented in FIG. 3) relative to a light source LA, which in the example described is a bank of halogen lamps with a high radiation power, advantageously in an optical absorption band of the thin film CM. In the example described, the term "rapid annealing" therefore means illumination of the film CM so as to allow at least partial crystallization of this thin film, for total durations of the order of 10 seconds. This rapid annealing is carried out in a lamp furnace (FIG. 3) in which the thin film can receive radiated powers of the order of $10 \text{ W/cm}^2$ or more by direct incidence. As a variant, rapid annealing may be carried out by induction heating using a current loop.

The energy transferred to the thin film during the rapid annealing activates the selenium (the selenium particularly being in excess outside the grains GR), which initiates agglomeration of the grains GR as per sintering. The nanometric grains GR in the precursor join together to form coarser grains with a substantially micrometric size. During the rapid annealing, the excess selenium plays an important role as an agent for recrystallization and defect passivation. This role is favored in particular by the short interatomic distances that the selenium has to cover. During the annealing, the homogeneous matrix structure of the precursor in turn plays an "internal lid" role for the selenium (by confinement) greatly limiting its exodiffusion.

The annealing may advantageously be carried out under atmospheric pressure, in ambient air, or alternatively under a neutral gas pressure (for example argon or nitrogen).

In the example described, the maximum power per unit area which the thin film actually receives is estimated at $25 \text{ W/cm}^2$, when considering the rated power of the lamps, the dispersion of the light between the lamps and the thin film, the losses by reflection, and the like.

Figure 7:
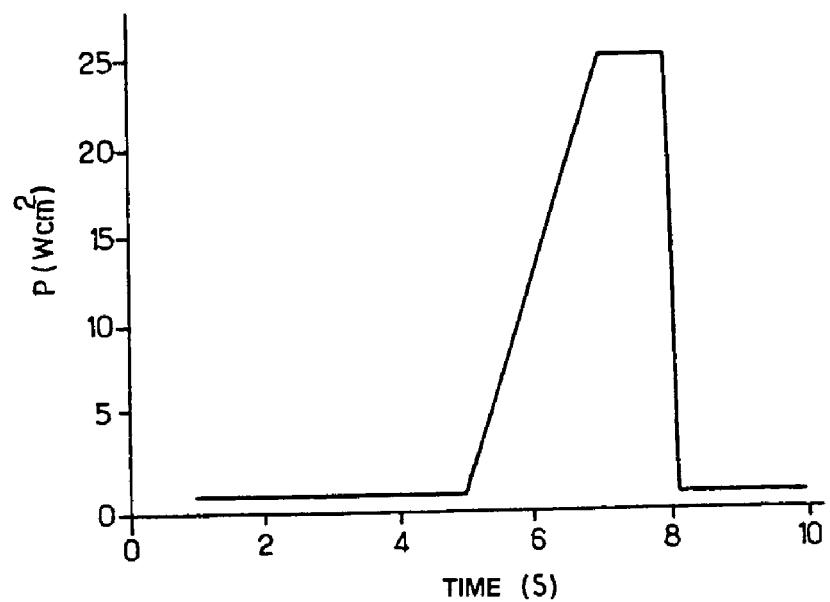
FIG. 7 illustrates a profile as a function of time of a power density transferred to the layer during a light pulse, by way of example.

FIG. 7 represents a pulse with a maximum power timed for 3 seconds. Leading and trailing edges of the light power delivered as a function of time can be seen, however, which are due to the inertia of the lamps. Now referring to FIG. 5, such a pulse has nevertheless made it possible to anneal a CIS thin film, satisfactorily crystallizing it so as to obtain good photovoltaic properties.

Figure 5:
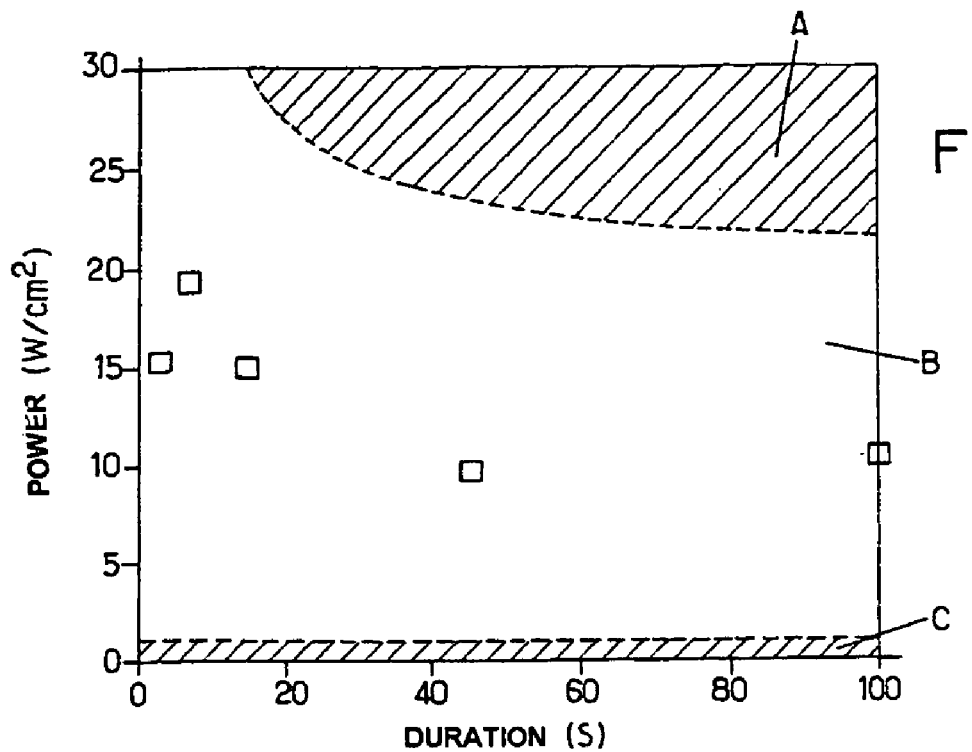
FIG. 5 illustrates, by way of example for CIS, pairings of durations (abscissa) and average illumination power densities (ordinate) making it possible to at least partially crystallize a layer without degrading it.

FIG. 5 represents experimental points (dark squares) corresponding to pairings of average light power/annealing duration which have made it possible to obtain crystallized layers. The aforementioned 3-second pulse corresponds to the first point on the left of the graphic. The zones A, B and C delimited by the broken curves correspond respectively to:

power/duration pairings in which the power is too great (zone A) and the layer is liable to be degraded during the annealing, power/duration pairings making it possible to obtain satisfactory crystallization of the layer (zone B), and power/duration pairings in which the power is not sufficient for annealing the layer correctly (zone C).

The working range of the annealing (zone B) in terms of "power/duration" pairing is thus delimited by a crystallization curve (lower power zone) and a film degradation curve (higher power zone). With high powers the Applicants sometimes observed degradation of the films, particularly the underlying molybdenum film. With powers that are too low and/or times that are too long, the crystallization is insufficient and evaporation of the selenium simply risks taking place, the saturated vapor pressure of the selenium already being significant at 200° C.

Figure 6:
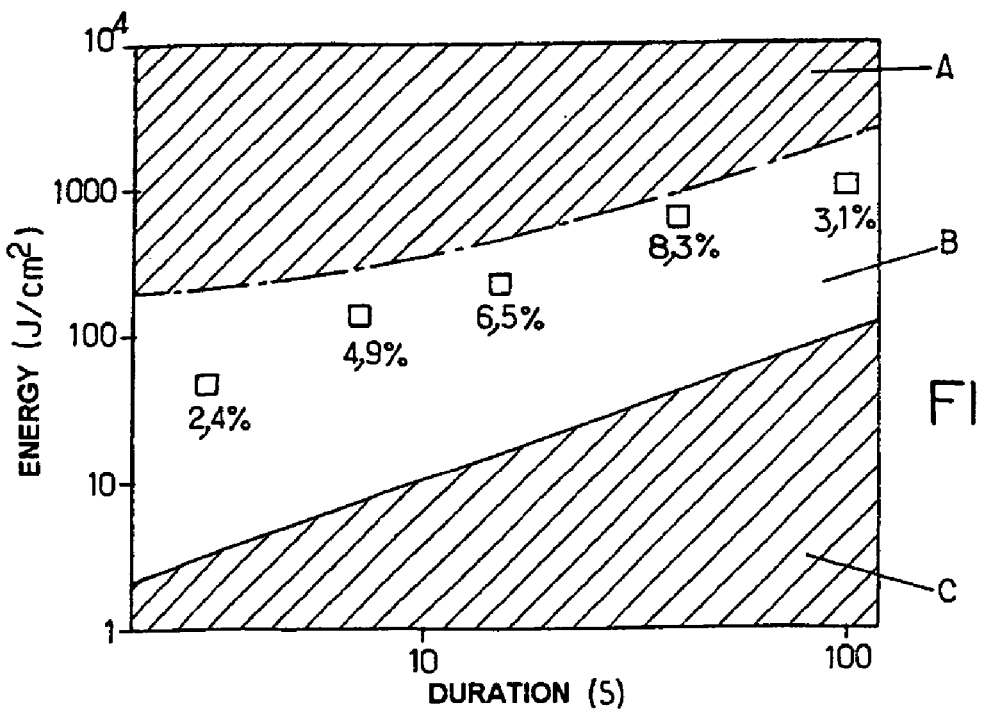
FIG. 6 illustrates another representation (here with logarithmic scales) of the pairings of durations (abscissa) and energies delivered to the layer (ordinate) making it possible to at least partially crystallize a CIS layer without degrading it, and to obtain the photovoltaic efficiencies indicated by way of illustration below the experimental points.

An experimental point in FIG. 5 (other than the aforementioned first point) may correspond to one or more successive light pulses, separated by periods without illumination. A more precise representation of these experimental points is given in FIG. 6, showing "delivered energy/ duration" pairings with logarithmic scales on the abscissa and ordinate. With such scales, the ranges are delimited by substantially linear curves.

Of course, these ranges are represented by way of illustration in FIGS. 5 and 6: they are merely intended to explain the phenomena involved.

The Applicants have nevertheless observed that with a layer thickness of close to one micron deposited on a glass substrate, the power transferred to the layer must be more than a few watts per cm$^2$ in order to commence sufficient crystallization. Advantageous annealing is obtained with a power in excess of 15 W/cm$^2$, for a duration less than a few tens of seconds.

It will be understood, however, that the selenium excess in the initial precursor may be reduced if the annealing durations are shorter.

After annealing, the thin film CM is advantageously recrystallized in a substantially equivalent or even better way compared with that which is obtained at the end of conventional annealing, under selenium vapor pressure, at temperatures in excess of 450° C. and for durations of close to one hour.

According to one of the advantages which the present invention offers, therefore, the premixed structure of the electrodeposited precursor is capable of favoring the recrystallization process, but with durations much shorter than those of conventional annealing.

In particular, the premixed structure obtained after the electrodeposition step allows more rapid and more controllable crystallization compared with the aforementioned method of deposition by sputtering thin films with the so-called "sheet" structure. This is because the electrolyzed matrix of precursors obtained after the deposition step comprises constituents which are intimately mixed on the atomic scale, and these constituents have no need to diffuse over great lengths (compared with the interatomic distances) in order to form the CuInSe$_2$ phase during the annealing.

In the conventional methods, furthermore, the quantity of excess selenium is customarily much more than 10% after the deposition step and before the annealing, which has a negative impact on the cost of obtaining good photovoltaic materials. As indicated above, another solution of the prior art consists in selenization in the presence of H$_2$Se gas. However, this gas is highly reactive and very toxic. With the method to which the present invention relates, therefore, photovoltaic performances are moreover obtained with relatively small initial quantities of selenium directly after the electrochemical deposition and without adding selenium during the annealing. Indeed, the rapid kinetics during the annealing greatly limit exodiffusion of the element Se out from the layer. This effect advantageously makes it possible to obviate the customary use which is made of the toxic gas H$_2$Se in the selenization methods, as well as any other addition of Se during the annealing step.

Nevertheless, the use of rapid annealing in the context of the present invention is also compatible with the addition of VI elements (for example selenium or sulfur in order to increase the band gap of the semiconductor) during the crystallization phase.

According to another advantage which the present invention offers, the relatively short annealing time makes it possible to limit the risks of deforming the substrate S as a result of very high temperatures. This substrate may be made of glass but also of any other material which can withstand minor temperature rises. This is because the combination of deposition from solution (by electrochemistry or by precipitation) at room temperature and rapid annealing allows recrystallization of the films without the substrate having the time to be damaged in a way which is detrimental to the intended application. Deposition on deformable substrates (for example made of plastic) may therefore be envisaged. Advantageously, a deposit on a polymer substrate such as KAPTON® may be annealed using one or more pulses with an illumination power of close to 25 W/cm$^2$ and lasting a few seconds. Furthermore, satisfactory results have also been obtained with CIS electrodeposited on a metallic substrate, such as an aluminum sheet. The Applicants then observed that the metallic substrate can advantageously withstand the rapid annealing which allows satisfactory recrystallization of the CIS. Electrochemical deposition on a conducting metal substrate advantageously makes it possible to obviate the underlying layer of molybdenum. Furthermore, deposition on a flexible substrate (such as an aluminum sheet or a KAPTON panel) advantageously makes it possible to produce materials for photovoltaic applications which can be fitted on board spacecraft, because of their light weight and their capacity for folding.

Figure 8:
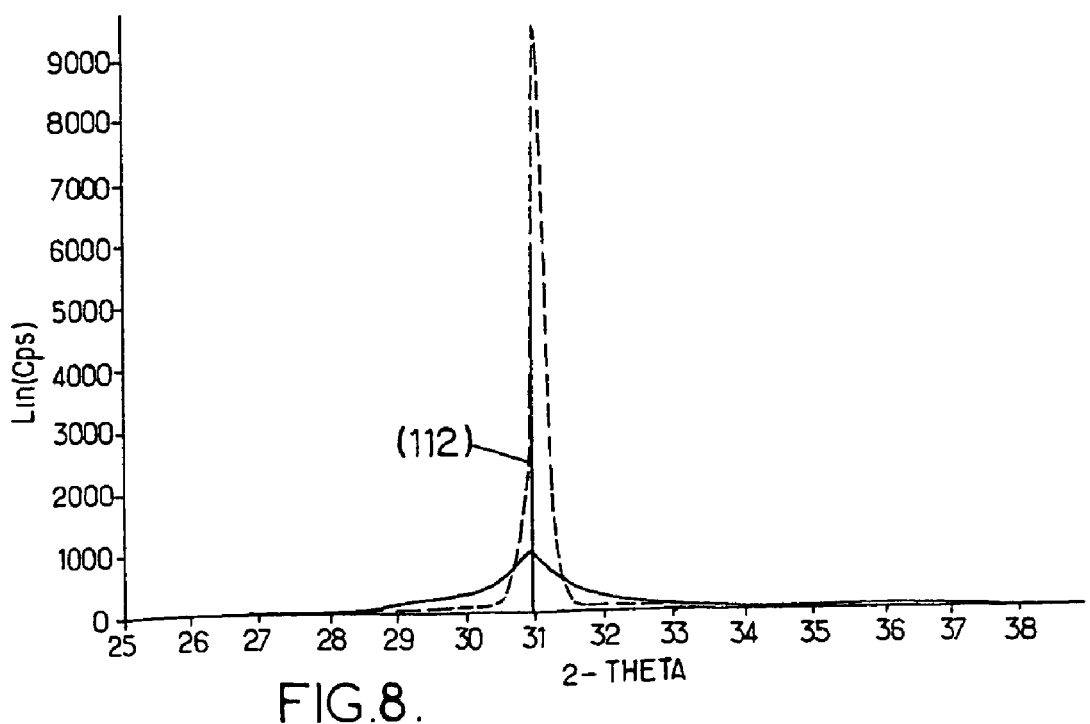
FIG. 8 illustrates X-ray intensity peaks obtained for variable θ orientations in the analysis of a CIS layer which has been electrodeposited (solid curve) and processed by rapid annealing (broken curve).

FIG. 8 represents an X-ray diffraction diagram of a CIS film before and after rapid annealing (respectively the solid curve and the broken curve). Before annealing, the line in the (112) plane which is characteristic of CIS is very broad and not very intense, which shows that the electrodeposited precursor is poorly crystallized. It is mostly the ternary phase of the CIS which appears here, however, while the binary phases or the elementary phases (for example Cu) appear virtually not at all. Essentially a superposition of the diffraction lines in the (112) plane of the CIS before and after annealing is thus observed. After annealing, however, the (112) line is finer and more intense.

After rapid annealing of the layer CM, photovoltaic cells are produced by depositing a thin layer of CdS and then a layer of ZnO by cathodic sputtering (FIG. 4). A final layer or an antireflection stack AR may optionally be provided so as to increase the efficiency of the solar cell. The cells produced in this way have photovoltaic properties leading to efficiencies of the order of 8% (FIG. 6) without gallium and without the antireflection layer AR represented in FIG. 4.

The combination of electrochemical deposition of premixed precursor elements and rapid annealing of the precursor layer thus leads to a method which is more rapid, less expensive (since the salts present in the bath B can be used in a subsequent electrolysis) and nonpolluting (thus eliminating the toxic release of H$_2$Se). Furthermore, the deposition takes place at room temperature and pressure (respectively about 20° C. and 1 atm). As indicated with reference to the table above, this method offers the possibility of processing large surface areas with good uniformity.

Of course, the present invention is not limited to the embodiment described above by way of example. It covers other variants.

A method for fabricating the CIS ternary was described above. Of course, deposition and processing by rapid annealing of the CIGS quaternary or the CIGSeS pentenary (with addition of sulfur) may be carried out under substantially identical conditions. In particular, the photovoltaic efficiency obtained with a CIGS layer would be substantially increased compared with that obtained from a CIS thin film.

It will be understood in particular that, being a VI element, the sulfur in a CuGa$_x$In$_{1-x}$Se$_{2-y}$S$_y$ composition also plays the role of an agent for recrystallization and defect passivation of the thin film during the annealing. Likewise, an initial sulfur excess may lead to the p-type semiconductor character of the layer being obtained after the annealing.

Electrochemical precursor deposition making it possible to obtain a matrix with a physicochemical nature which is the same as that of the desired alloy was described above. Other types of deposition from solution may nevertheless be provided, such as deposition by heterogeneous precipitation on a substrate.

More generally, yet other types of deposition may be envisaged. By evaporation, a matrix of Cu—In—Ga—Se—S precursors is deposited with a low substrate temperature. The composition of the matrix is defined by the evaporation rate of the pure elements in the respective sources. If the substrate is not heated, then the matrix will not be very crystallized but will have a composition which is easier to control. This matrix may furthermore undergo rapid annealing in the context of the present invention.

Furthermore, other semiconductor alloys of the chalcogenide type (alloys including an element from column VI of the periodic table (S, Se, Te)), such as cadmium telluride CdTe may also be used in order to fabricate photovoltaic cells. The same problem of different respective volatilities between Cd and Te is observed when wishing to obtain a CdTe layer suitable for photovoltaic applications. However, CdTe thin films can be deposited and annealed according to the same steps of the method in the context of the invention. For example, cadmium telluride (CdTe) films may be prepared by electrodeposition in a bath of cadmium sulfate (about 1 mol/l) saturated with dissolved tellurium oxide $TeO_2$, with an acid pH of around 2 or less. The deposition potential is −1 volt with respect to a mercury(I) sulfate reference electrode. Rapid annealing in the context of the present invention is then provided in order to recrystallize the layer.

The invention claimed is:

1. A method of fabricating I-III-$VI_2$ semiconductor alloys in thin films for photovoltaic applications, wherein:
   a) a thin film of a precursor with a slightly excess composition of VI element compared with a final desired alloy composition is deposited on a substrate, the constituent elements of the precursor being intimately mixed so as to give the precursor a structure having nanometric alloy grains joined by phases which are richer in VI element, and
   b) rapid annealing of the layer obtained in step a) is carried out using an electromagnetic radiation source, with an electromagnetic power greater than or of the order of a few $W/cm^2$, which is sufficient to activate the VI element and make all of said alloy grains react so as to improve the crystallization of said layer, and for durations less than or of the order of tens of seconds, which are sufficiently short to obtain substantially said desired composition in the layer and give said layer photovoltaic properties.

2. The method as claimed in claim 1, wherein most of the alloy grains obtained in step a) have a composition close to said desired composition.

3. The method as claimed in claim 1, wherein said desired composition corresponds substantially to $CuGa_xIn_{1-x}Se_{2-y}S_y$ with x between 0 and 1 and y between 0 and 2.

4. The method as claimed in claim 1, wherein the overall composition of the precursor has a slight excess of III element.

5. The method as claimed in claim 1, wherein said thin film is deposited by electrochemistry in step a).

6. The method as claimed in claim 5, wherein an underlying layer of molybdenum is deposited on the substrate prior to step a).

7. The method as claimed in claim 5, wherein said desired composition corresponds substantially to $CuGa_xIn_{1-x}Se_{2-y}S_y$ with x between 0 and 1 and y between 0 and 2 and wherein the electrodeposition is carried out in a substantially acid bath comprising salts of copper and indium and/or gallium, as well as selenium oxide in dissolved form and/or sulfur salts.

8. The method as claimed in claim 1, wherein said alloy grains have a physicochemical nature close to that of the alloy obtained in step b), and together they form a matrix capable of withstanding an abrupt temperature rise during the annealing step b).

9. The method as claimed in claim 8, wherein the temperature of the layer is raised to more than 450° C. in step b).

10. The method as claimed in claim 9, wherein the power transferred to the layer is more than 5 $W/cm^2$.

11. The method as claimed in claim 10, wherein the power transferred to the layer is more than 10 $W/cm^2$, for a duration shorter than 30 seconds.

12. The method as claimed in claim 11, wherein the power transferred to the layer is of the order of 20 $W/cm^2$, for a duration shorter than 10 seconds.

13. The method as claimed in claim 1, wherein the excess of VI element in the overall composition of the precursor is less than or of the order of 10%.

14. The method as claimed in claim 1, wherein the substrate is made of a plastic material.

15. The method as claimed in claim 1, wherein the substrate is made of a metallic material, preferably aluminum.

16. The method as claimed in claim 1, wherein a protective layer that covers the alloy layer, and which is capable of limiting any exodiffusion of VI element out from the alloy layer during the annealing step b), is furthermore deposited in step a).

17. The method as claimed in claim 16, wherein said protective layer is soluble at least after the annealing step b).

* * * * *